United States Patent
Yu et al.

(10) Patent No.: US 6,410,371 B1
(45) Date of Patent: Jun. 25, 2002

(54) METHOD OF FABRICATION OF SEMICONDUCTOR-ON-INSULATOR (SOI) WAFER HAVING A SI/SIGE/SI ACTIVE LAYER

(75) Inventors: Bin Yu, Cupertino; William G. En, Milpitas; Judy Xilin An, San Jose; Concetta E. Riccobene, Mountain View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/794,884

(22) Filed: Feb. 26, 2001

(51) Int. Cl.[7] .............................................. H01L 21/84
(52) U.S. Cl. ...................... 438/151; 438/311; 438/455; 438/459; 438/977
(58) Field of Search ................................. 438/455, 459, 438/977, 151, 311

(56) References Cited

U.S. PATENT DOCUMENTS

| | | |
|---|---|---|
| 5,234,535 A | 8/1993 | Beyer et al. |
| 5,438,015 A | 8/1995 | Lur |
| 5,461,243 A | 10/1995 | Ek et al. |
| 5,461,250 A | 10/1995 | Burghartz et al. |
| 5,583,059 A | 12/1996 | Burghartz |
| 5,683,934 A | 11/1997 | Candeleria |
| 5,686,735 A | 11/1997 | Sim |
| 5,714,777 A | 2/1998 | Ismail et al. |
| 5,847,419 A | 12/1998 | Imai et al. |
| 5,849,627 A | 12/1998 | Linn et al. |
| 5,906,951 A | 5/1999 | Chu et al. |
| 5,963,817 A | 10/1999 | Chu et al. |
| 5,998,807 A | 12/1999 | Lustig et al. |
| 6,059,895 A | 5/2000 | Chu et al. |
| 6,153,495 A | 11/2000 | Kub et al. |

*Primary Examiner*—Long Pham
(74) *Attorney, Agent, or Firm*—Renner, Otto, Boisselle & Sklar, LLP

(57) ABSTRACT

A method of forming a semiconductor-on-insulator (SOI) wafer. The method includes the steps of providing a first wafer, the first wafer having a silicon substrate and an oxide layer disposed thereon; providing a second wafer, the second wafer having a silicon substrate, the substrate of the second wafer having a silicon-germanium layer disposed thereon, a silicon layer disposed on the silicon-germanium layer and an oxide layer disposed on the silicon layer; wafer bonding the first and second wafers; and removing an undesired portion of the substrate from the second wafer to form an upper silicon layer. The resulting SOI wafer structure is also disclosed.

13 Claims, 3 Drawing Sheets

METHOD OF FABRICATION OF SEMICONDUCTOR-ON-INSULATOR (SOI) WAFER HAVING A SI/SIGE/SI ACTIVE LAYER

TECHNICAL FIELD

The present invention generally relates to semiconductor-on-insulator (SOI) integrated circuits and, more particularly, to an SOI wafer having a Si/SiGe/Si active layer and a method of fabricating the SOI wafer using a wafer bonding process.

BACKGROUND ART

Traditional semiconductor-on-insulator (SOI) integrated circuits typically have a silicon substrate having a buried oxide (BOX) layer disposed thereon. A silicon active layer is disposed on the BOX layer. Within the active layer, active devices, such as transistors, are formed in active regions. The size and placement of the active regions are defined by isolation regions. As a result of this arrangement, the active devices are isolated from the substrate by the BOX layer. More specifically, a body region of each SOI transistor does not have body contacts and is therefore "floating."

SOI chips offer potential advantages over bulk chips for the fabrication of high performance integrated circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased.

However, the mobility of the carriers (i.e., electrons or holes) within the silicon of the active layer, and primarily in a channel portion of the body region, is limited. Therefore, there exists a need in the art to increase the mobility of the carriers within the channel of SOI devices.

SUMMARY OF THE INVENTION

According to one aspect of the invention, the invention is a method of forming a semiconductor-on-insulator (SOI) wafer. The method includes the steps of providing a first wafer, the first wafer having a silicon substrate and an oxide layer disposed thereon; providing a second wafer, the second wafer having a silicon substrate, the substrate of the second wafer having a silicon-germanium layer disposed thereon, a silicon layer disposed on the silicon-germanium layer and an oxide layer disposed on the silicon layer; wafer bonding the first and second wafers; and removing an undesired portion of the substrate from the second wafer to form an upper silicon layer.

According to another aspect of the invention, the invention is a semiconductor-on-insulator (SOI) wafer. The wafer includes a silicon substrate; a buried oxide. (BOX) layer disposed on the substrate; and an active layer disposed on the BOX layer, the active layer having an upper silicon layer disposed on a silicon-germanium layer, the silicon-germanium layer disposed on a lower silicon layer, wherein the silicon-germanium of the silicon-germanium layer is strained silicon-germanium and is about 200 Å to about 400 Å thick.

BRIEF DESCRIPTION OF DRAWINGS

These and further features of the present invention will be apparent with reference to the following description and drawings, wherein.

DISCLOSURE OF INVENTION

Figure 1:
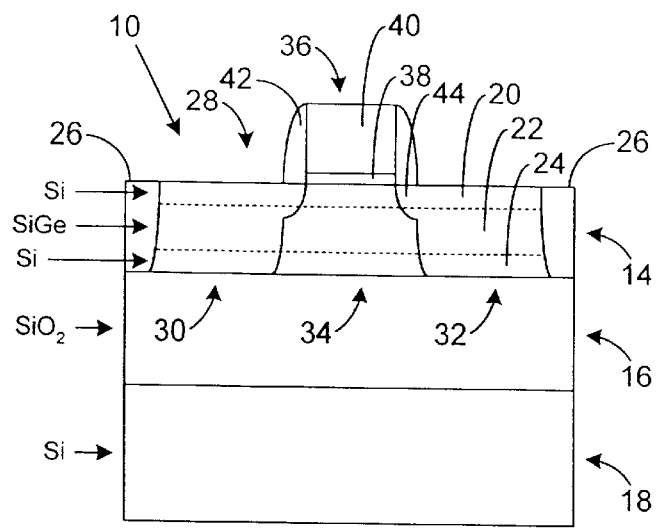
FIG. 1 is a cross-sectional view of an exemplary semiconductor-on-insulator (SOI) device fabricated on an SOI wafer according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form. Referring to FIG. 1, an exemplary semiconductor-on-insulator (SOI) device 10 is illustrated. The device 10 is fabricated on an SOI wafer 12 which has been fabricated in accordance with the present invention. The wafer 12 has an active layer 14 disposed on a buried oxide (BOX) layer 16. The BOX layer 16 is disposed, in turn, on a silicon substrate 18. A method of fabricating the SOI chip 10 is described in more detail below.

The active layer 14 is comprised of three sublayers, namely, an upper silicon layer 20 disposed on a silicon-germanium layer 22 which is disposed on a lower silicon layer 24. Thus, the active layer 14 forms a silicon/silicon-germanium/silicon, or Si/SiGe/Si, stack. The upper silicon layer 20 is about 100 Å to about 200 Å thick. The silicon-germanium layer 22 is about 200 Å to about 400 Å thick and is made from strained silicon-germanium. The atomic concentration of silicon in the silicon-germanium layer 22 is about 30% to about 70% and the atomic concentration of germanium in the silicon-germanium layer 22 is about 30% to about 70%. The lower silicon layer 24 is about 100 Å to about 200 Å thick. The BOX layer 16 upon which the active layer 14 is disposed is about 1100 Å to about 4200 Å thick.

Within the active layer 14, isolation regions 26, such as shallow trench isolation (STI) regions, define the placement of active regions 28 used for the fabrication of active devices, such as the illustrated device 10. The fabrication of active devices, using the active layer 14 is well known in the art and will not be described in great detail. In addition, hundreds, thousands or even millions of interconnected active devices may be formed on the wafer 12. The devices formed on the wafer can also include other circuit elements such as transistors, diodes, resistors, capacitors and the like.

The illustrated device 10 is a partially depleted metal oxide semiconductor field effect transistor (MOSFET). However, one skilled in the art will immediately recognize that the illustrated SOI device 10 is merely exemplary. Within the active layer, the device 10 has a source 30 and a drain 32 with a body 34 disposed therebetween. Disposed on top of the body 34 is a gate 36. The gate 36 has a gate oxide layer 38 disposed on the silicon upper layer 20 and a polysilcon gate portion 40 disposed on the gate oxide layer 38. Side wall spacers 42 are disposed adjacent the gate 36. Alternative gate stack arrangements, as are known in the art, and can also be used for the device 10. The source 30 and drain 32 are doped appropriately for the formation of a N-type device or a P-type device. More specifically, during fabrication of the device 10 and before the spacers 42 are formed, the source 30 and drain 32 are doped to form extensions 44. The extensions 44 can have a dopant concentration of about $1.0 \times 10^{19}$ atoms/cm$^3$ to about $1.0 \times 10^{20}$ atoms/cm$^3$. Following spacer 42 formation, the source 30 and drain 32 are doped again with deep implants. The deep implants can have a dopant concentration of about $1.0 \times 10^{20}$ atoms/cm$^3$ to about $1.0 \times 10^{21}$ atoms/cm$^3$. It is noted that before formation of any of the foregoing device 10 components and doping of the source 30 and drain 32, the active layer 14 can be initially doped for the establishment of an N-channel or a P-channel device.

Within the body 34, the silicon-germanium layer 22 serves as the channel. To a lesser extent, the upper silicon layer 20 and the lower silicon layer 24 may also serve as a portion of the channel. However, focusing on the silicon-germanium layer 22 as being the main channel region of the device 10, the carriers (including holes and electrons) in the strained silicon-germanium of the silicon-germanium layer 22 have a much higher mobility than traditional silicon channel devices. As a result, the performance of the device 10 is increased by virtue of the silicon-germanium channel.

The presence of the upper silicon layer 20 assists in forming a high quality gate oxide 38 layer. More particularly, the germanium content of the silicon-germanium layer 22 hinders oxide formation. Since oxides tend to form better on a silicon layer, a thin layer of silicon (i.e., the upper silicon layer 20) is provided on the silicon-germanium layer 22 so that the gate oxide 38 can be formed. As will be discussed in more detail below, the lower layer of silicon 24 helps to form an oxide layer used in a wafer bonding process to fabricate the wafer 12.

Figure 2:
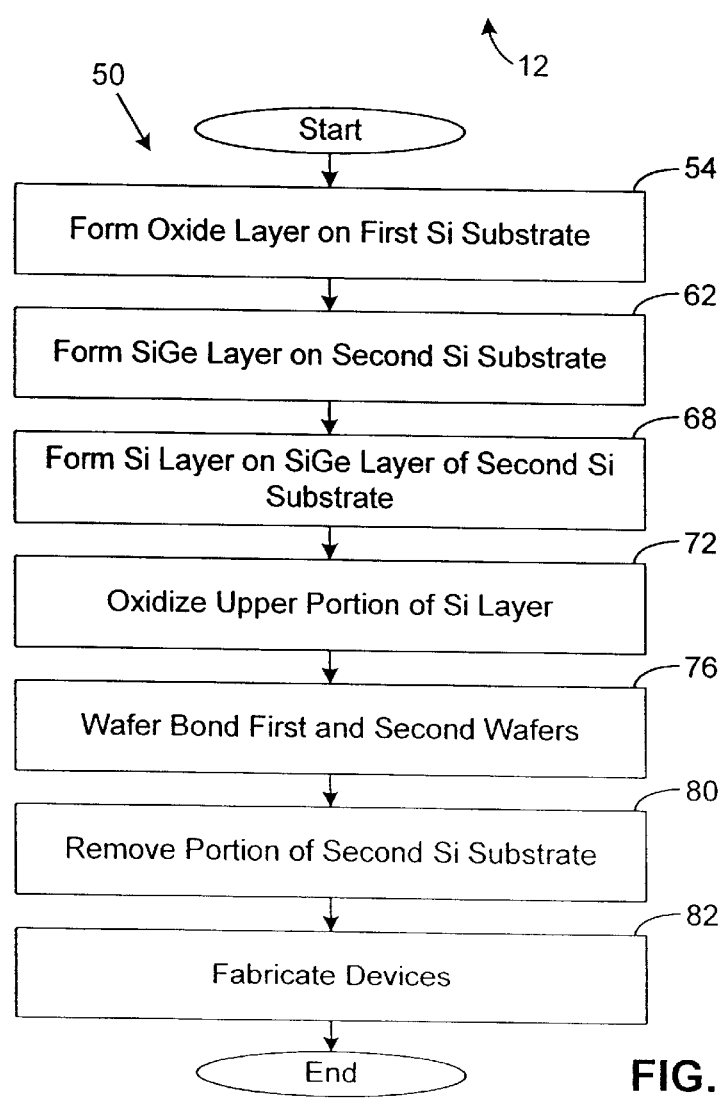
FIG. 2 is a flowchart of a method of fabricating an SOI wafer according to the present invention.
Figure 3A:
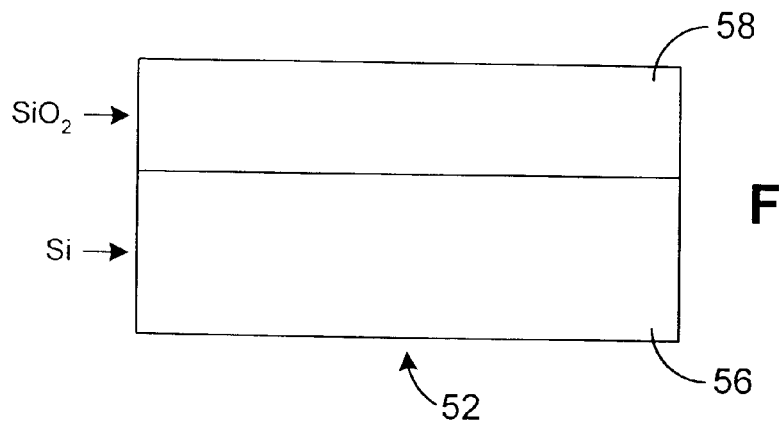
FIGS. 3A–3F are cross-sections of an SOI wafer according to the present invention in various stages of fabrication.

Referring now to FIG. 2, a method 50 of fabricating the wafer 12 is illustrated in flowchart format. With additional reference to FIG. 3A, the method starts by forming a first wafer 52. More specifically, in step 54, a first silicon substrate 56 is processed such that an oxide layer 58 is formed in a upper region of the silicon substrate 56. The oxide layer 58 is about 1000 Å to about 4000 Å thick. The oxide layer 58 can be formed using a number of known techniques, such as thermal oxidation or by implanting oxygen ions into an upper region of the first silicon substrate 56. Should the oxide layer 58 be formed using thermal oxidation, the silicon substrate 56 is subjected to a thermal cycle having a temperature of about 1000° C. to about 1200° C. for about two seconds to about one minute in a pure (i.e., 100%), or nearly pure, oxygen atmosphere. The oxygen in the atmosphere reacts with the silicon of the silicon substrate 56 to form silicon dioxide ($SiO_2$), resulting in the oxide layer 58.

Figure 3B:
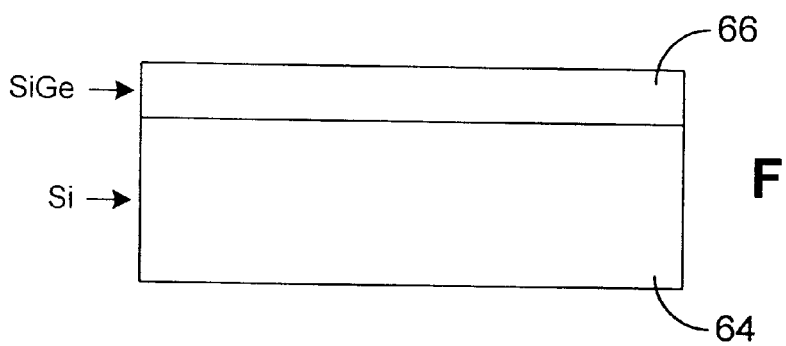

After the first wafer 52 is formed, a second wafer 60 (FIG. 3D) is formed. With additional reference to FIG. 3B, formation of the second wafer 60 starts in step 62 where a second silicon substrate 64 is processed such that a strained silicon-germanium layer 66 is formed thereon. The silicon-germanium layer 66 is about 200 Å to about 400 Å thick and, at the conclusion of the method 50, will become the silicon-germanium layer 22 (FIG. 1). The silicon-germanium layer 66 is formed by depositing silicon-germanium using selective or nonselective epitaxy. Alternatively, germanium can be implanted into an upper region of the silicon substrate 64.

Figure 3C:
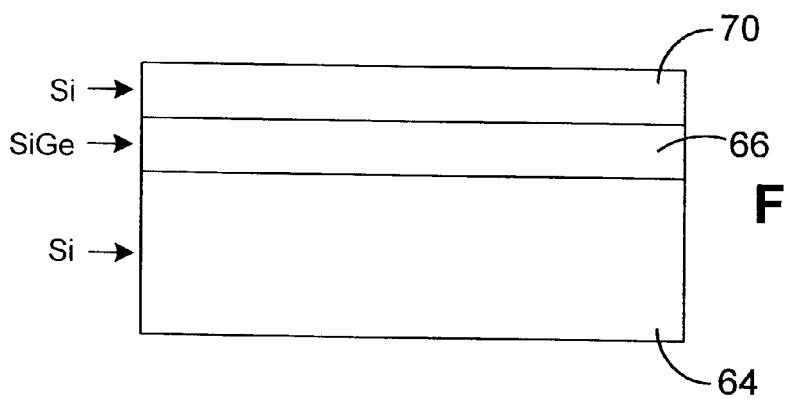

Next, in step 68 and as illustrated in FIG. 3C, a silicon layer 70 is formed on the silicon-germanium layer 66. The silicon layer 70 has a thickness of about 200 Å to about 400 Å. The silicon layer 70 can be formed using, for example, selective or nonselective epitaxy.

Figure 3D:
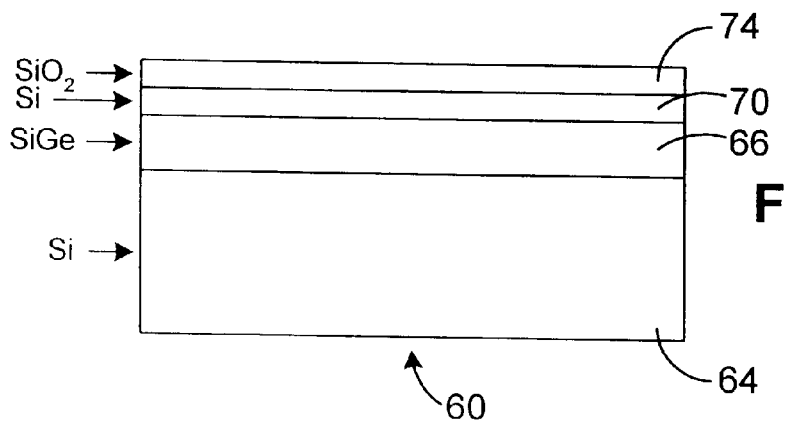

Next, in step 72 and as illustrated in FIG. 3D, the silicon layer 70 is processed such that an oxide layer 74 is formed in an upper region of the silicon layer 70. The oxide layer 74 is about 100 Å to about 200 Å thick. The remaining silicon of the silicon layer 70 is about 100 Å to about 200 Å thick and, at the conclusion of the method 50, will become the lower silicon layer 24 (FIG. 1). The oxide layer 74 can be formed using a number of known techniques, such as thermal oxidation or by implanting oxygen ions into an upper region of the silicon layer 70. Should the oxide layer 74 be formed using thermal oxidation, the silicon layer 70 is subjected to a thermal cycle having a temperature of about 1000° C. to about 1200° C. for about two seconds to about one minute in a pure (i.e., 100%), or nearly pure, oxygen atmosphere. The oxygen in the atmosphere reacts with the silicon of the silicon layer 70 to form silicon dioxide ($SiO_2$), resulting in the oxide layer 74.

Following steps 62, 68 and 72, the second wafer 60 has a silicon substrate 64 with a silicon-germanium layer 66 disposed thereon. Disposed on the silicon-germanium layer 66 is a silicon layer 70 having an oxide layer 74 disposed thereon.

Figure 3E:
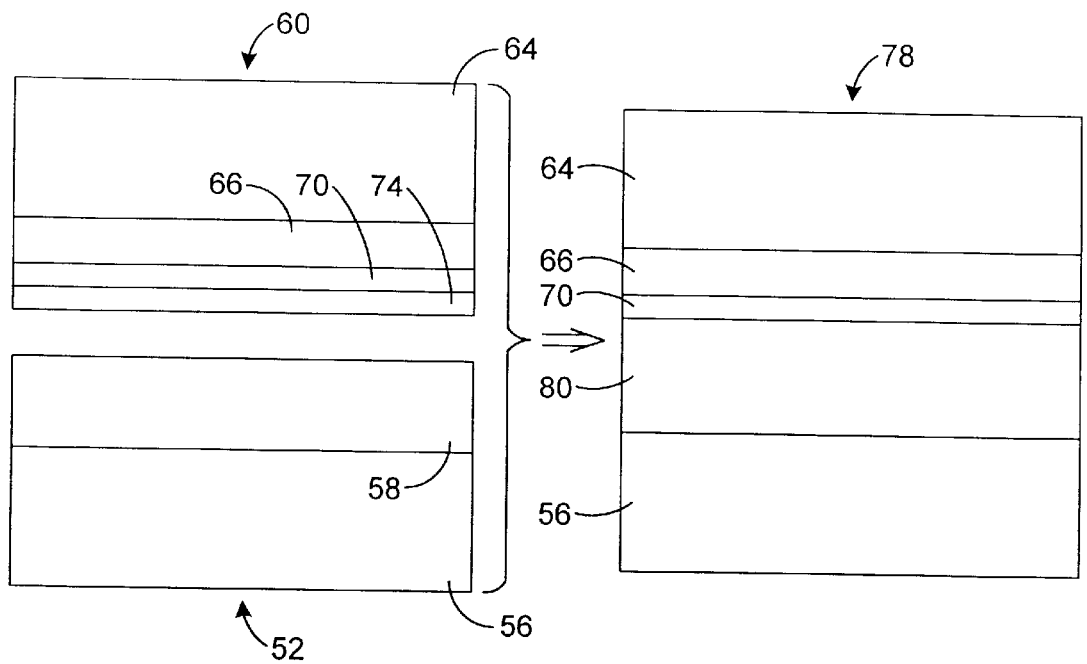

Next, in step 76 and as illustrated in FIG. 3E, the first wafer 52 and the second wafer 60 are combined using a wafer bonding technique to form a third wafer 78. Wafer bonding is well known in the art and, therefore, will only be briefly discussed herein. Briefly, in a nitrogen ($N_2$) atmosphere, the second wafer 60 is inverted and placed in contact with the first wafer 54 such that the oxide layer 74 is contacting the oxide layer 58. The oxide layers 58 and 74 bond to form an oxide layer 80 which, at the conclusion of the method 50, will become the BOX layer 16 (FIG. 1).

Figure 3F:
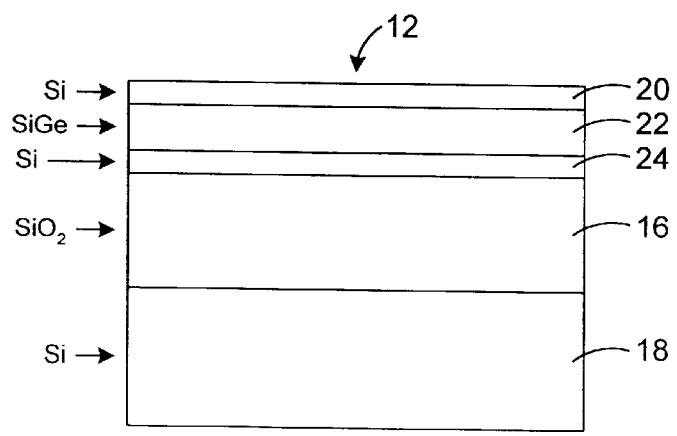

In step 80, and as illustrated in FIG. 3F, the third wafer 78 is processed to reduce the thickness of the second substrate 64 to a thickness of about 100 Å to about 200 Å. The remaining silicon of the second substrate 64 becomes the upper layer of silicon 20. The silicon of the second substrate 64 can be removed by controlled mechanical removal using, for example, mechanical polishing followed by a chemical-mechanical polish (CMP). To assist in reducing the thickness of the second substrate 64, an embedded weak zone can be formed in the second substrate 64 along which the second substrate is broken and a top portion removed. The remaining silicon material can be polished to the desired thickness of the upper silicon layer 20.

Following removal of the undesired portion of the second substrate 64, the wafer 12 results. More specifically, the wafer 12 is comprised of the active layer 14 which includes the upper silicon layer 20 disposed on the silicon-germanium layer 22 which is disposed on the lower layer of silicon 24. The active layer 14 is disposed on the BOX layer 16, which, in turn, is disposed on the substrate 18. Once the wafer 12 is fabricated, active devices can be fabricated in step 82. These active devices can include, for example, MOSFETs such as the device 10 illustrated in FIG. 1.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of forming a semiconductor-on-insulator (SOI) wafer, comprising the steps of:

providing a first wafer, the first wafer having a silicon substrate and an oxide layer disposed thereon;

providing a second wafer, the second wafer having a silicon substrate, the substrate of the second wafer having a silicon-germanium layer disposed thereon, a silicon layer disposed on the silicon-germanium layer and an oxide layer disposed on the silicon layer;

wafer bonding the first and second wafers; and removing an undesired portion of the substrate from the second wafer to form an upper silicon layer.

2. The method according to claim 1, wherein the oxide layer disposed on the substrate of the first wafer is formed by thermal oxidation of the substrate.

3. The method according to claim 1, wherein the silicon-germanium layer is formed on the substrate of the second wafer using epitaxy.

4. The method according to claim 3, wherein the silicon layer disposed on the silicon-germanium layer is formed using epitaxy.

5. The method according to claim 4, wherein the oxide layer disposed on the silicon layer is formed by thermal oxidation of the silicon layer.

6. The method according to claim 1, wherein oxide layer disposed on the substrate of the first wafer is about 1000 Å to about 4000 Å thick.

7. The method according to claim 1, Wherein the silicon-germanium layer formed on the substrate of the second wafer is about 200 Å to about 400 Å thick.

8. The method according to claim 1, wherein the silicon layer disposed on the silicon-germanium layer is about 100 Å to about 200 Å thick.

9. The method according to claim 1, wherein the oxide layer disposed on the silicon layer is about 100 Å to about 200 Å thick.

10. The method according to claim 1, wherein the upper silicon layer is about 100 Å to about 200 Å thick.

11. The method according to claim 1, wherein the atomic concentration of silicon in the silicon-germanium layer is about 30% to about 70% and the atomic concentration of germanium in the silicon-germanium layer is about 30% to about 70%.

12. The method according to claim 1, wherein the silicon-germanium of the silicon-germanium layer is strained.

13. The method according to claim 1, further comprising the step of forming an active device, the active device having a channel formed from the silicon-germanium layer.

* * * * *